United States Patent
Nihei

(10) Patent No.: US 8,011,099 B2
(45) Date of Patent: Sep. 6, 2011

(54) METHOD OF MANUFACTURING ORIENTATION FILM AND METHOD OF MANUFACTURING LIQUID DISCHARGE HEAD

(75) Inventor: Yasukazu Nihei, Kaisei-machi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/133,330

(22) Filed: Jun. 4, 2008

(65) Prior Publication Data
US 2008/0271300 A1 Nov. 6, 2008

Related U.S. Application Data

(62) Division of application No. 11/378,427, filed on Mar. 20, 2006, now Pat. No. 7,785,659.

(30) Foreign Application Priority Data

Mar. 22, 2005 (JP) ................ 2005-081968

(51) Int. Cl.
| | |
|---|---|
| *B21D 53/76* | (2006.01) |
| *B23P 17/00* | (2006.01) |
| *H01L 41/22* | (2006.01) |
| *H01R 17/00* | (2006.01) |
| *B05D 1/04* | (2006.01) |
| *B05D 5/12* | (2006.01) |

(52) U.S. Cl. ....... 29/890.1; 29/25.35; 427/475; 427/100
(58) Field of Classification Search ............ 29/890.1, 29/25.35, 847; 427/100, 372.2, 475–486; 310/358; 117/4–8
See application file for complete search history.

(56) References Cited

U.S. PATENT DOCUMENTS

| | | | | |
|---|---|---|---|---|
| 5,303,705 | A * | 4/1994 | Nenov | 600/410 |
| 6,510,340 | B1 * | 1/2003 | Jordan | 600/544 |
| 6,531,657 | B1 * | 3/2003 | Jones et al. | 174/72 A |
| 6,618,885 | B1 * | 9/2003 | Blaustein | 7/107 |
| 6,620,237 | B2 * | 9/2003 | Hoisington | 117/68 |
| 6,628,538 | B2 * | 9/2003 | Funaba et al. | 365/63 |
| 6,836,940 | B2 * | 1/2005 | Usui et al. | 29/25.35 |

(Continued)

FOREIGN PATENT DOCUMENTS

JP 04-188503 7/1992

(Continued)

OTHER PUBLICATIONS

A Review of Ceramic Materials for Optical Applications, Akio Ikesue, Laser Review, (Speciak Issue Development of Advance Optical Materials for Laser), The Laser Society of Japan, Jun. 2002, vol. 30 No. 6, pp. 290-296.

(Continued)

*Primary Examiner* — A. Dexter Tugbang
*Assistant Examiner* — David P Angwin
(74) *Attorney, Agent, or Firm* — Sughrue Mion, PLLC

(57) ABSTRACT

A method of manufacturing an orientation film which method is suitable for manufacturing an orientation film containing a ceramic at low cost. The method includes the steps of: (a) forming a film containing a piezoelectric ceramic on a seed substrate in which crystal orientation is controlled at least on a surface thereof by using an aerosol deposition method of injecting powder toward a substrate and depositing the powder on the substrate; and (b) heat-treating the ceramic film formed at step (a) to form an orientation film in which crystal grains contained in the ceramic film is oriented.

6 Claims, 9 Drawing Sheets

U.S. PATENT DOCUMENTS

| | | | | |
|---|---|---|---|---|
| 7,565,723 | B2* | 7/2009 | Sugahara et al. | 29/25.35 |
| 7,785,659 | B2* | 8/2010 | Nihei | 427/100 |
| 2002/0194725 | A1* | 12/2002 | Perea et al. | 29/749 |
| 2003/0196320 | A1* | 10/2003 | Ikeda et al. | 29/749 |
| 2003/0234835 | A1* | 12/2003 | Torii et al. | 347/68 |
| 2004/0143966 | A1* | 7/2004 | Soriano | 29/868 |
| 2004/0244188 | A1* | 12/2004 | Hutchinson | 29/753 |
| 2005/0185025 | A1* | 8/2005 | Shimada et al. | 347/68 |
| 2006/0068105 | A1* | 3/2006 | Osawa | 427/248.1 |

FOREIGN PATENT DOCUMENTS

| | | |
|---|---|---|
| JP | 11-348297 | 12/1999 |
| JP | 2003-267796 A | 9/2003 |
| JP | 2003-267800 A | 9/2003 |
| JP | 2003-298132 A | 10/2003 |

OTHER PUBLICATIONS

Japanese Office Action dated Jun. 22, 2010, corresponding to Japanese Patent Application No. 2006-039544.

* cited by examiner

HEAT

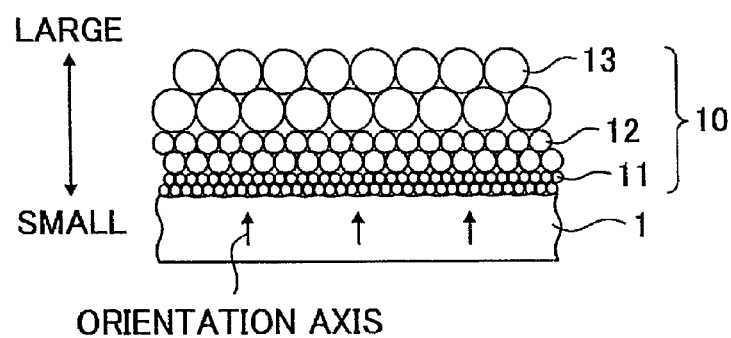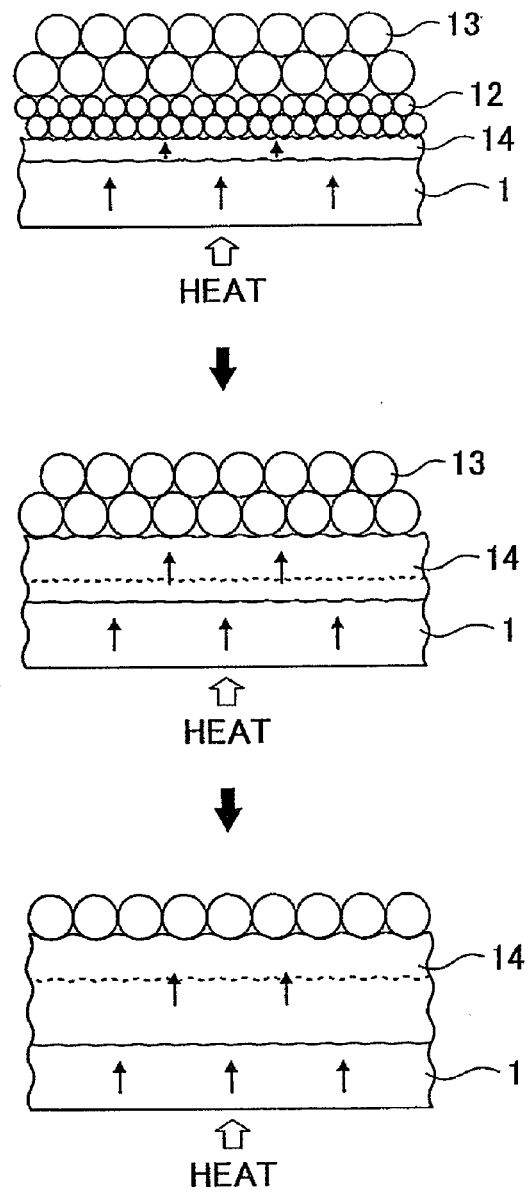

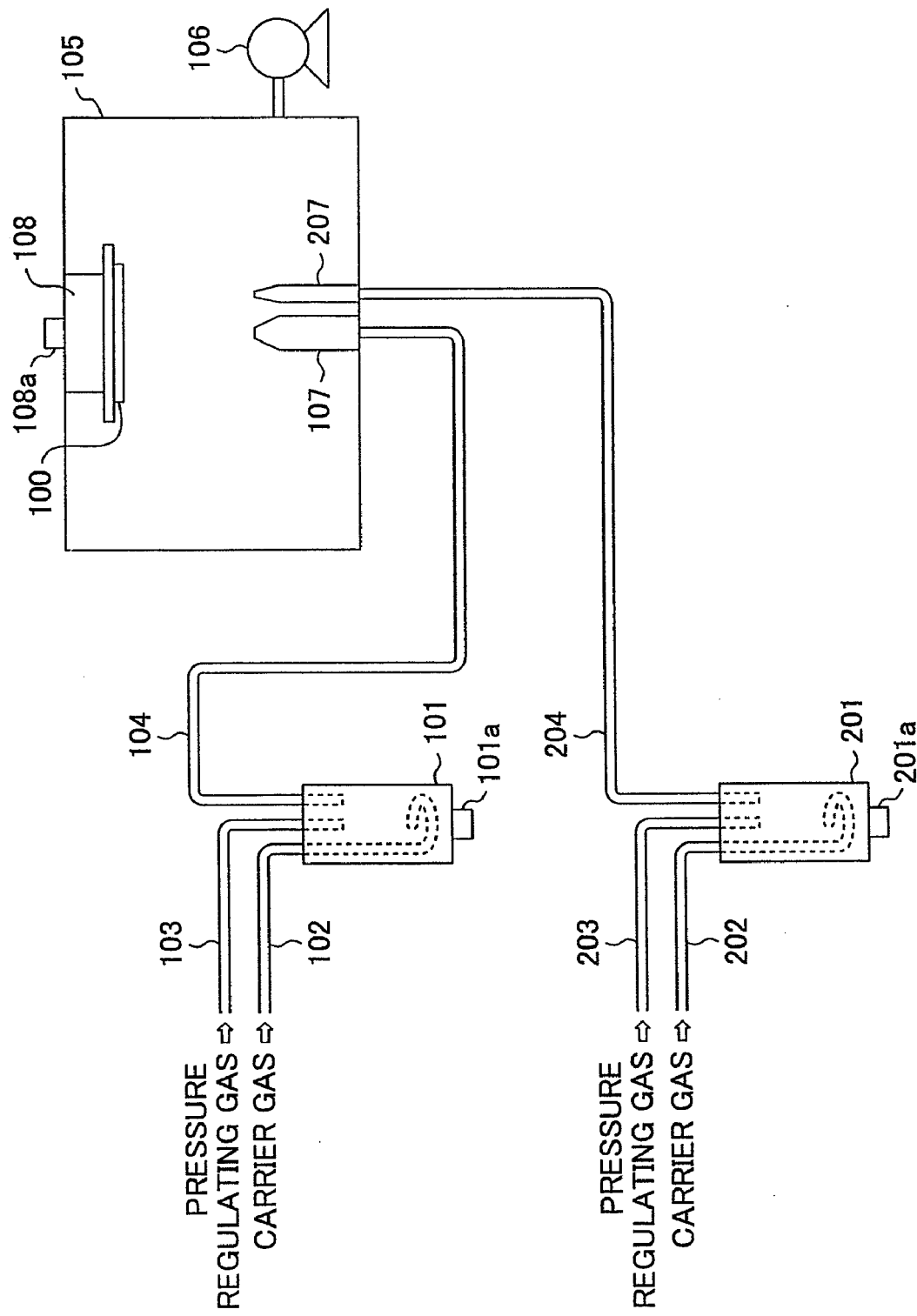

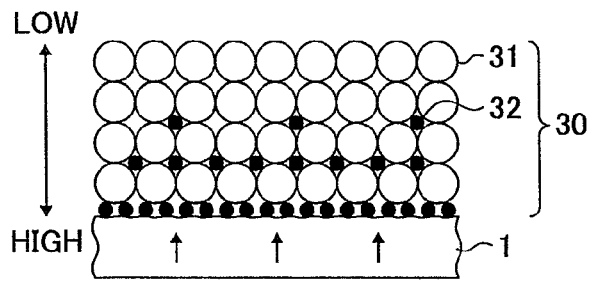
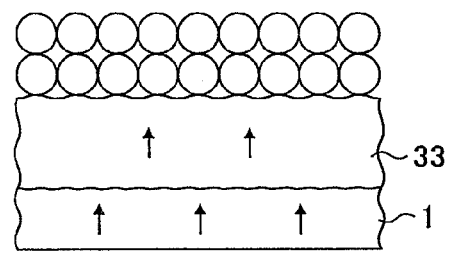
FIG.8A  FIG.8B
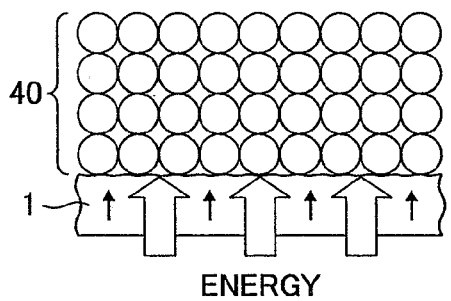
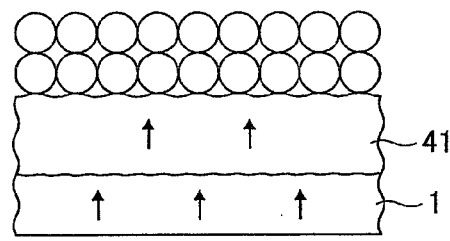
FIG.9A  FIG.9B
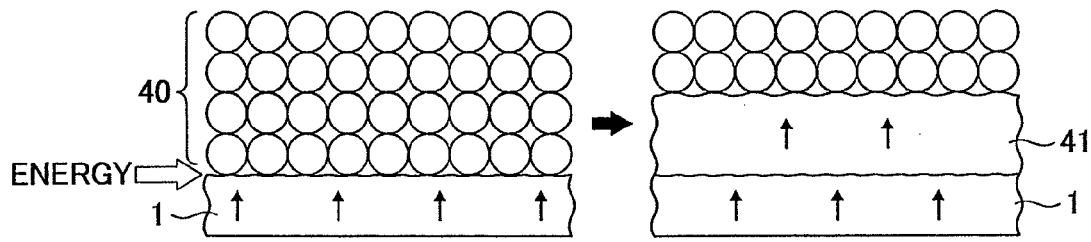
FIG.10

US 8,011,099 B2

METHOD OF MANUFACTURING ORIENTATION FILM AND METHOD OF MANUFACTURING LIQUID DISCHARGE HEAD

This is a divisional of application Ser. No. 11/378,427 filed Mar. 20, 2006 now U.S. Pat. No. 7,785,659. The entire disclosure(s) of the prior application(s), application number(s) Ser. No. 11/378,427 is considered part of the disclosure of the accompanying divisional application and is hereby incorporated by reference.

BACKGROUND OF THE INVENTION

1. Field of the Invention

The present invention generally relates to a method of manufacturing an orientation film, and specifically to a method of manufacturing a ceramic orientation film containing a piezoelectric ceramic. Furthermore, the present invention relates to a method of manufacturing a liquid discharge head (injection head) utilizing such a method of manufacturing an orientation film.

2. Description of a Related Art

A structure in which electrodes are formed on both sides of a piezoelectric material is utilized in various applications such as a piezoelectric actuator, a piezoelectric pump, an ink head of an inkjet printer and an ultrasonic transducer. In recent years, with the developments of MEMS (micro electro mechanical systems) related devices, elements having such structures have been microfabricated still further and packaged more densely. Accordingly, microfabrication and improvement in performance are desired for the piezoelectric material used there.

In the case where a piezoelectric ceramic such as PZT (Pb(lead) zirconate titanate) is used as a piezoelectric material, in order to improve the performance thereof, it is important to increase the degree of crystalline orientation in a piezoelectric material. Poling treatment of applying an electric field to the piezoelectric ceramic to align the orientation of electric duplexes in a crystal is performed such that the piezoelectric ceramic produces piezoelectric effect. This is because the higher the degree of crystalline orientation, the easier the poling, and therefore, higher piezoelectric performance is obtained.

By the way, there is epitaxial growth as a method of forming an orientation film including a single crystal film or a polycrystalline film in which crystals are oriented to some degree. The epitaxial growth refers to a technology by which an orientation film is grown on an orientation substrate of single crystal or the like, and vapor phase growth or liquid phase growth is normally used. Solid phase growth is not generally used because of slow growth rate, poor controllability and so on.

The fabrication of a single crystal film or orientation film by solid phase growth is disclosed in Ikesue, "A Review of Ceramic Materials for Optical Applications", Laser Review (Special Issue "Development of Advanced Optical Materials for Laser"), The Laser Society of Japan, June 2002, Vol. 30, No. 6, pp. 290-296, and Japanese Patent Application Publications JP-P2003-267796A and JP-P2003-267800A. Ikesue teaches the principle of single-crystallization of a polycrystalline YIG ceramic by sintering the polycrystalline YIG ceramic in contact with seed crystals and the structural change from the polycrystalline YIG ceramic to a single crystal YIG ceramic (see FIGS. 21 and 22).

Further, JP-P2003-267796A discloses an oxide that can provide advantageous properties as a piezoelectric material and so on. The oxide is a single crystal or an orientation polycrystal having a perovskite structure containing components A, B and oxygen, and porosity of 0.01 volume percent to 8 volume percent.

Furthermore, JP-P2003-267800A discloses a high-quality oxide ion conductive crystalline material and a method of efficiently manufacturing the same. The oxide ion conductive crystalline material is substantially formed by orientation polycrystal expressed by $Re_x(MO_4)_6O_{1.5X-12}$ or single crystal with the number "n" per unit area (number/cm$^2$) of crystal particles forming low-angle grain boundary where $0 \leq n \leq 10^2$.

JP-P2003-267796A and JP-P2003-267800A disclose that, as a method of manufacturing a crystalline material, single crystallization or orientation of a polycrystalline sintered material with a seed crystal as a starting point by bringing the sintering material and the single crystal material (seed crystal) in contact and performing temperature control of heating the contact part and cooling ends of other parts (see FIG. 4 of JP-P2003-267796A and FIG. 4 of JP-P2003-267800A).

In the method of orienting a crystal by the solid phase growth, there have been four main problems as follows.

The first problem is that the polycrystalline ceramic material and the single crystal material are located in contact with each other. Here, it is important, for the single crystal material to capture fine particles of a ceramic for solid phase growth, that both are in close contact at the interface thereof. For the purpose, it is necessary to mirror-polish the single crystal face, bringing the polycrystalline ceramic material and the single crystal material in pressure contact, or filling the interface with a liquid phase material such that no gap is produced at the interface between them. However, such a step is added, the entire manufacturing process becomes complex and the apparatuses and equipment become complicated. Further, in the case where the area of the orientation film is increased, it is very difficult to uniformize the surfaces of the polycrystalline ceramic material and the single crystal material.

The second problem is that the ceramic sintered compact is used as a target to be oriented (polycrystalline ceramic material). In order to promote solid phase growth, it is more advantageous that the ceramic sintered compact is fabricated from micro particles. This is because the surface energy of particles is higher as the diameter is smaller, and the energy provided from the outside is lower. However, to fabricate a compact by using microparticles, binder is needed to maintain the shape. The binder comes out at the time of sintering, and thereby, pores are produced in the sintered compact. Accordingly, a dense film with particles in close contact with one another cannot be formed. Alternatively, sintering of the pressed compact of fine particles is conceivable. However, in this case, it is necessary to produce grain growth by heating the pressed compact afterwards. That is, the particle diameter has already been large at the time of fabrication of a ceramic sintered compact, and therefore, considerable energy is required to promote the solid phase growth from the condition.

The third problem is that the direction of orientation is controlled by temperature gradient. In order to orient the polycrystalline ceramic material, it is necessary to suppress the random grain growth and give priority to solid phase growth from the seed substrate (seed crystal) side. For the purpose, in the conventional technology, the temperature gradient is provided by heating the seed substrate side of the polycrystalline ceramic material and cooling end regions of the polycrystalline ceramic material. For example, in JP-P2003-267796A, the temperature gradient is set as 10° C./cm or more (p. 10). However, it is difficult to precisely control the temperature gradient, and the control of the temperature gradient is virtually impossible in the case where a film having a thickness of ten to several hundreds of micrometers is oriented.

The fourth problem is that the single crystal substrate is used as the starting point of solid phase growth. This is because the single crystal substrate is generally expensive and often restricted in area. Accordingly, the problem is a major issue in cost and technology when the device is put into practical use.

SUMMARY OF THE INVENTION

The present invention has been achieved in view of the above-mentioned problems. A first object of the present invention is to provide a method of manufacturing an orientation film which method is suitable for manufacturing an orientation film containing a ceramic at low cost. Further, a second object of the present invention is to provide a method of manufacturing a liquid discharge head by utilizing such a method of manufacturing an orientation film.

In order to achieve the above-mentioned objects, a method of manufacturing an orientation film according to one aspect of the present invention includes the steps of: (a) forming a film containing a raw material on a seed substrate in which crystal orientation is controlled at least on a surface thereof by using an aerosol deposition method of injecting powder toward a substrate and depositing the powder on the substrate; and (b) heat-treating the film formed at step (a) to form an orientation film in which crystal grains contained in the film is oriented.

Further, a method of manufacturing a liquid discharge head according to one aspect of the present invention is a method of manufacturing a liquid discharge head having (i) a pressure chamber to be filled with a liquid and defined by a vibrating plate, a partition wall, and a nozzle plate provided with a discharge opening, and (ii) a piezoelectric actuator for vibrating the vibrating plate to discharge the liquid stored in the pressure chamber from the discharge opening, and the method includes the steps of: (a) forming a film containing a piezoelectric ceramic on a seed substrate in which crystal orientation is controlled at least on the surface thereof by using an aerosol deposition method of injecting powder toward a substrate and depositing the powder on the substrate; and (b) heat-treating the film formed at step (a) to form a piezoelectric ceramic orientation film in which crystal grains contained in the film is oriented; (c) forming an electrode on the piezoelectric ceramic orientation film; (d) forming the vibrating plate on the electrode; (e) forming the partition wall for defining the pressure chamber on the vibrating plate; and (f) forming the nozzle plate with the discharge opening on the partition wall.

Here, the aerosol deposition (AD) method refers to a film forming method of injecting an aerosol, in which raw material powder is dispersed, from a nozzle toward a substrate to cause the raw material powder to collide with the substrate or the like, and thereby, depositing the raw material on the substrate or the like. Further, the aerosol refers to a colloid system in which solid or liquid particles are floating (dispersed) in a gas. In the present application, the particles dispersed in the aerosol are also referred to as the aerosol in the wide sense. In an aerosol generated when the aerosol deposition method is performed, various sizes of particles (raw material powder) may be dispersed in a gas, and in the case where a ceramic film containing PZT is formed, for example, particles having a diameter on the order of 0.1 μm to 10 μm are used.

According to the present invention, the film in uniform, strong, and close contact with the seed substrate can be formed by performing film formation using the aerosol deposition method, and the solid phase growth can progress uniformly and efficiently from the seed substrate side in the subsequent heat treatment. Therefore, high quality orientation films can be manufactured in the simple process. Further, since the crystal can be oriented even at relatively low heat treatment temperature, the range of choices of substrate materials can be expanded. Therefore, industrial ceramic film orienting process can be realized at low cost by using inexpensive materials such as silicon. Furthermore, since the property of a functional material such as a piezoelectric material film can be improved by using such a method of manufacturing an orientation film, the performance of the liquid discharge head using a piezoelectric actuator including the piezoelectric material film as driving means can be improved and the cost of manufacturing the liquid discharge head can be reduced.

BRIEF DESCRIPTION OF THE DRAWINGS

FIGS. 3A and 3B are diagrams for explanation of the method of manufacturing an orientation film according to the first embodiment of the present invention;

FIG. 7 is a schematic diagram showing a film forming apparatus according to the AD method provided with another mechanism of supplying an additive;

FIGS. 8A and 8B are diagrams for explanation of the method of manufacturing an orientation film according to the third embodiment of the present invention;

FIGS. 9A and 9B are diagrams for explanation of the method of manufacturing an orientation film according to the fourth embodiment of the present invention;

FIG. 10 is a diagram for explanation of a modified example of the method of manufacturing an orientation film according to the fourth embodiment of the present invention;

DESCRIPTION OF THE PREFERRED EMBODIMENTS

Figure 1A:
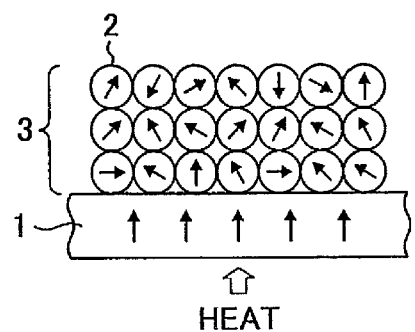
FIGS. 1A and 1B are diagrams for explanation of a principle used in methods of manufacturing an orientation film according to the first to fourth embodiments of the present invention.

Hereinafter, preferred embodiments of the present invention will be described in detail by referring to the drawings. The same reference numerals are assigned to the same component elements and the description thereof will be omitted.

First, a principle used in methods of manufacturing an orientation film according to the first to fourth embodiments of the present invention will be explained by referring to FIGS. 1A and 1B.

Figure 1B:
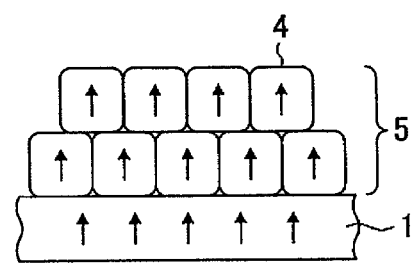

FIG. 1A shows a state in which a film 3 constructed of crystal grains 2 is provided on a seed substrate 1. Here, the "seed substrate" refers to a substrate in which the crystal orientation is controlled at least on the surface thereof, and a single crystal substrate oriented in a desired orientation or a polycrystal substrate having high degree of orientation is used as the seed substrate. In a condition in which the crystal orientation is not controlled in the film 3, the orientation of the crystal grains 2 contained therein is random.

When the film 3 is subjected to heat treatment at a high temperature less than the melting point of the material, the crystal grains 2 grow remaining in the solid phase. At the time, if crystal grain growth proceeds sequentially from the seed substrate 1 side, the crystal grains 2 are sequentially oriented in a direction in a certain relationship with the crystal orientation of the seed substrate 1. FIG. 1B shows an orientation film 5 formed by crystal grains 4 that have grown in the solid phase while oriented according to the crystal orientation of the seed substrate 1.

Such a method of growing the crystal grains while controlling the crystal orientation is called "solid phase epitaxial growth". In the first to fourth embodiments as described below, the orientation film is manufactured by using the solid phase epitaxial growth.

Figure 2:
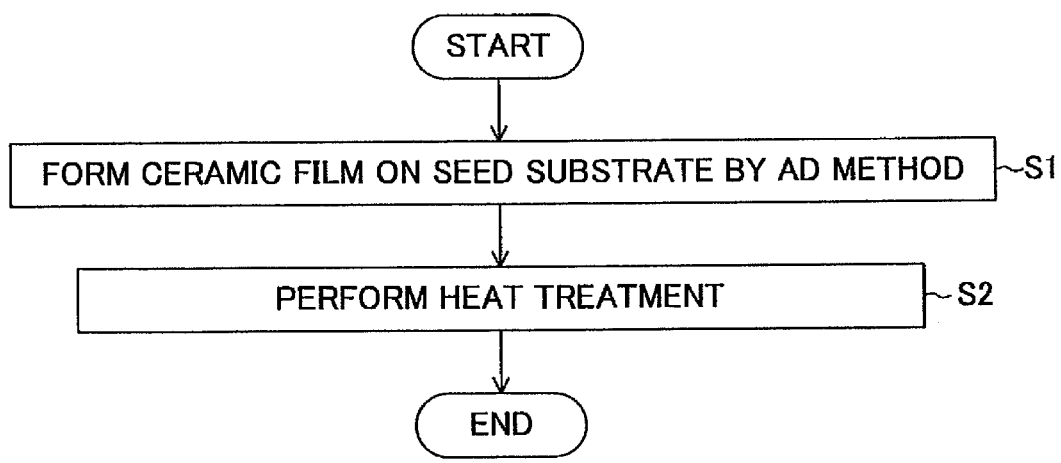
FIG. 2 is a flowchart showing the methods of manufacturing an orientation film according to the first to fourth embodiments of the present invention.

FIG. 2 is a flowchart showing the method of manufacturing an orientation film according to the first embodiment of the present invention. Further, FIGS. 3A and 3B are diagrams for explanation of the method of manufacturing an orientation film according to the embodiment.

First, at step S1 in FIG. 2, a ceramic film 10 having a predetermined particle diameter distribution is formed on the seed substrate 1 as shown in FIG. 3A. In this regard, the film formation is performed by using an aerosol deposition (AD) method, which will be described later.

As the seed substrate 1, a single crystal substrate of magnesium oxide (MgO), SRO (SrRuO: strontium ruthenium oxide), etc., or a polycrystal substrate in which crystal grains are oriented to some degree is used.

In the embodiment, the ceramic particles 11 to 13 contained in the ceramic film 10 are distributed such that the diameter changes along the thickness direction. That is, the particle diameter gradually increases from the layer (lower layer) near the seed substrate 1 toward the upper layer. FIG. 3A shows, from the layer near the seed substrate 1, a layer containing ceramic particles 11 having the smallest diameter, a layer containing ceramic particles 12 having the next smallest diameter, and a layer containing ceramic particles 13 having the larger diameter. The method of forming the film having such particle diameter distribution will be described later in detail.

Then, at step S2 in FIG. 2, heat treatment is performed on the ceramic film 10 formed at step S1. Here, the particle diameter is a dominant factor for determining surface energy, and the smaller the particle diameter, the higher the surface energy. Further, the higher the surface energy, the less energy the solid phase growth proceeds with. Accordingly, the ceramic particles are arranged previously such that the diameter gradually increases from the layer near the seed substrate 1 toward the upper layer as shown in FIG. 3A, and thereby, priority is given to the solid phase growth from the layer near the seed substrate 1 without the need of precise temperature control in the ceramic film as shown in FIG. 3B. Thus, an orientation film 14 in which crystal grains are oriented according to the crystal orientation of the seed substrate 1 is obtained.

Next, the method of forming the ceramic film 10 will be described in detail.

In the embodiment, the AD method is used for forming the ceramic film 10 in which particles having different diameters are distributed along the thickness direction. The AD method is a method of generating an aerosol in which raw material powder is dispersed in a gas, injecting it from a nozzle onto a substrate, and thereby depositing the raw material on the substrate. The AD method is also called "injection deposition method" or "gas deposition method".

Figure 4:
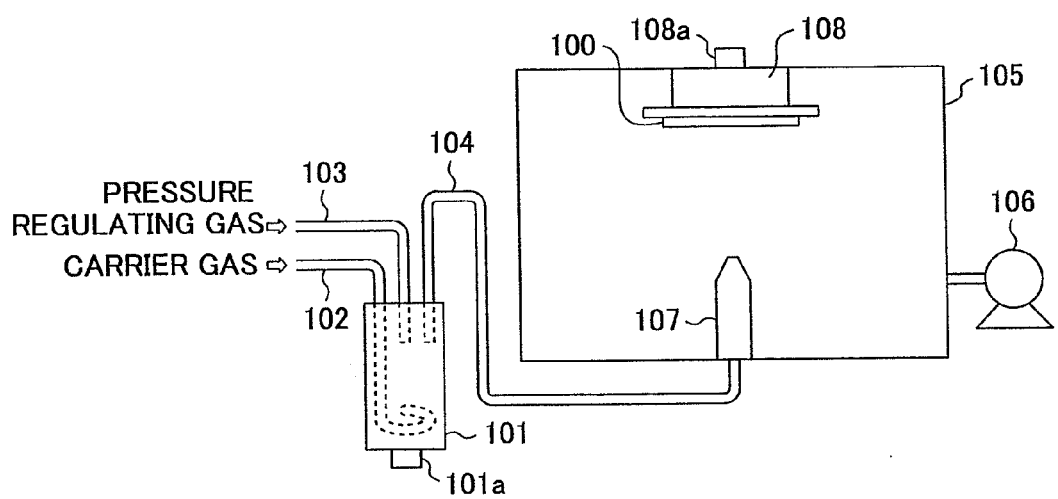
FIG. 4 is a schematic diagram showing a film forming apparatus using the aerosol deposition (AD) method.

FIG. 4 is a schematic diagram showing a film forming apparatus using the AD method. The film forming apparatus includes an aerosol generation chamber 101, a raising gas nozzle 102, a pressure regulating gas nozzle 103, an aerosol carrying pipe 104, a film formation chamber 105, an exhaust pump 106 and a substrate holder 108. The raising gas nozzle 102, the pressure regulating gas nozzle 103 and the aerosol carrying pipe 104 are provided to the aerosol generation chamber 101.

The aerosol generation chamber 101 is a container in which raw material powder is placed. In the aerosol generation chamber 101, there is provided a container driving part 101a for providing vibration to the aerosol generation chamber 101 to agitate the raw material powder placed therein.

A compressed gas cylinder for supplying a carrier gas is connected to the raising gas nozzle 102 provided to the aerosol generation chamber 101. As the carrier gas, nitrogen ($N_2$), oxygen ($O_2$), helium (He), argon (Ar), dry air or the like is used. The raising gas nozzle 102 produces a cyclone flow by injecting the gas supplied from the compressed gas cylinder into the aerosol generation chamber 101. Thereby, the raw material powder placed within the aerosol generation chamber 101 is raised and dispersed to generate an aerosol.

On the other hand, a compressed gas cylinder for supplying a pressure regulating gas for regulating the gas pressure within the aerosol generation chamber 101 is connected to the pressure regulating gas nozzle 103. As the pressure regulation gas, nitrogen ($N_2$), oxygen ($O_2$), helium (He), argon (Ar), dry air or the like is also used. By adjusting the flow rate of the pressure regulating gas to control the pressure within the aerosol generation chamber 101, the speed of the air flow (cyclone flow) produced within the aerosol generation chamber 101 is controlled. For example, when the gas pressure of the pressure regulating gas is raised, the speed of the cyclone flow becomes higher. Then, only the raw material powder having a relatively small diameter is raised by the classification action because of centrifugal separation of the cyclone flow. Contrary, when the gas pressure of the pressure regulation gas is reduced, the speed of the cyclone flow becomes lower. Then, the classification action of the cyclone flow becomes weak, and the raw material powder having a relatively large diameter is also raised. Accordingly, the particle diameter of the raw material powder contained in the aerosol can be controlled by adjusting the flow rate of the pressure regulating gas.

The aerosol carrying pipe 104 provided to the aerosol generation chamber 101 carries the aerosol containing the raw material powder raised within the aerosol generation chamber 101 to a nozzle 107 provided in the film formation chamber 105.

The interior of the film formation chamber 105 is exhausted by the exhaust pump 106, and thereby, held at a predetermined degree of vacuum.

The injection nozzle 107 has an opening in predetermined shape and size (e.g., a rectangle having the long side of about 5 mm and the short side of about 0.5 mm), and injects the aerosol supplied from the aerosol generation chamber 101 via the aerosol carrying pipe 104 toward a substrate 100 at a high speed.

The substrate holder 108 holds the substrate 100. Further, the substrate holder 108 is provided with a substrate holder driving part 108a for moving the substrate holder 108 in a three-dimensional manner. Thereby, the three-dimensional relative position and relative speed between the injection nozzle 107 and the substrate 100 are controlled. By controlling the relative speed, the thickness of a film formed for one reciprocation can be controlled.

In the film forming apparatus shown in FIG. 4, ceramic powder having a diameter within the predetermined range is placed as the raw material in the aerosol generation chamber 101, and the seed substrate 1 (see FIG. 3A) is set in the substrate holder 108. Further, the seed substrate 1 is kept at a predetermined film formation temperature, and the film forming apparatus is driven to inject the aerosol from the nozzle 107. Thereby, the raw material powder accelerated to a high speed collides against an under layer such as the seed substrate 1 or a deposit previously formed, and is deposited thereon. Meanwhile, the substrate holder 108 is moved at a predetermined speed for repeated scanning while changing the raw material powder contained in the aerosol by regulating the flow rate of the pressure regulating gas. Thereby, a ceramic film having a desired thickness having controlled particle diameter distribution can be formed.

Here, the raw material powder (ceramic powder) contained in the aerosol is injected from the nozzle, collides against the substrate or the like, and crushed. The diameter of the raw material powder at the time of being injected and the diameter of the crushed particles (ceramic particles) crushed and taken into the film have nearly proportional relationship with each other. Accordingly, the particle diameter distribution within the film can be controlled by controlling the particle diameter of the raw material powder in the aerosol.

Advantages of the formation of the ceramic film 10 as shown in FIG. 3A by using such an AD method will be described.

In the AD method, a film is formed according to the mechanism that fine particles of a raw material having certain kinetic energy collide with a substrate at a high-speed, crushed into ultrafine particles having diameters of several nanometers to several tens of nanometers, and a new active surface produced by the crushing adheres to the substrate or plural active surfaces bind with each other. Such film formation mechanism is called mechanochemical reaction. Accordingly, very strong adhesion is realized not only between the fine particles but also between fine particles and the substrate regardless of whether the substrate is a single crystal or polycrystal orientation substrate. Therefore, uniform adhesion between the ceramic film and the seed substrate is stably ensured unlike the arrangement of a previously formed ceramic material and a seed substrate in contact. Naturally, the conventionally performed step of ensuring the adhesion between both such as polishing of the ceramic material surface and the seed substrate surface is unnecessary. Thus, the uniform and strong substrate adhesion that is required to uniformly promote the solid phase growth can be easily obtained.

Further, as described above, the crushed fine particles also bind strongly with one another in the film (AD film) formed by the AD method, and that is very advantageous in smooth progress of solid phase growth. Further, since the AD film contains no binder, which is required in a general ceramic compact for maintaining the shape thereof before sintering, no pore is formed within the film after heat treatment. That is, a very dense film can be fabricated. It is confirmed that, Vickers hardness of a PZT (Pb(lead) zirconate titanate) film fabricated by general pressure forming and sintering is about 300 Hv to 400 Hv, whereas Vickers hardness of a PZT film fabricated by the AD film is about 600 Hv to 700 Hv before sintering.

Furthermore, in the AD method, since the fine particles of the raw material crushed by the collision are deposited on the substrate, the diameter of the fine particles (crushed particles) contained in the AD film is very small as several nanometers to several tens of nanometers. Here, the particle diameter is a dominant factor for determining surface energy, and the smaller the particle diameter, the higher the surface energy. Therefore, in the AD film with small particle diameter, crystal grain growth can progress even when the energy provided from the outside is small. In other words, solid phase growth is allowed at relatively low heat treatment temperature.

Moreover, the AD film is formed by a so-called buildup method of sequentially depositing a raw material from lower layers unlike a general sintered ceramic. Accordingly, the raw material powder can be distributed in the AD film such that the particle size after crushing and the composition of the raw material change along the thickness direction. Therefore, the progress direction of the solid phase growth can be controlled by locating raw material powder having different particle diameters with a gradient. Since priority is given to solid phase growth from the seed substrate side when the diameter nearer the seed substrate side is made smaller, the crystal orientation of the seed substrate reflects the crystal orientation in the AD film. Here, in conventional film forming methods such as sintering method, sputtering method, and chemical solution method, it is very difficult to control the composition and so on along the thickness direction in a film having a thickness on the order of several micrometers to several hundreds of micrometers. In that regard, such control can be performed easily by the AD method.

In addition, a film can be formed at relatively low temperature (e.g., substrate temperature of 600° C.) by the AD method. Further, as described above, solid phase growth is allowed even at relatively low heat treatment temperature (e.g., 800° C.) by the AD method. Thus, since the treatment temperature can be made lower than that in the conventional art in both steps of film formation and heat treatment, the range of choices of materials available as a seed substrate can be expanded. By the way, in general solid phase growth of a ceramic, heat treatment is often performed at a high temperature of about 1200° C. or more.

As a working example, a PZT orientation film is fabricated on a single crystal substrate of magnesium oxide (MgO). Here, the reason for using the MgO single crystal as a seed substrate is it is conceivable that the epitaxial growth of PZT becomes easier because the lattice constant of MgO is relatively close to the lattice constant of PZT.

For this purpose, at first, the substrate temperature is set to 600° C. in the film forming apparatus as shown in FIG. 4, and a PZT film having a thickness of about 10 μm is formed on the MgO substrate (step S1). In the PZT film, diameters of PZT particles (crushed particles) are distributed with a gradient such that the particle diameter at the interface between the PZT film and the substrate becomes about 0.01 μm and the particle diameter at the upper surface of the PZT film becomes about 1 μm. Such control of particle diameter distribution is performed in the following manner. That is, in the film forming apparatus shown in FIG. 4, immediately after the starting of film formation, an aerosol is generated by raising only the raw material powder having a relatively small particle diameter (e.g., PZT powder having a center particle diameter of about 1 µm) because of the classification action produced by increasing the gas pressure of the pressure regulating gas nozzle 103, and a film is formed. Then, as the film deposited on the seed substrate becomes thicker, the raw material powder having a relatively large particle diameter (e.g., PZT powder having a center particle diameter of about 10 µm near the upper surface of the PZT film) is raised. Concurrently, the thickness of the film formed for one reciprocation is adjusted by controlling the relative speed of the seed substrate and the nozzle 107, and the number of times of reciprocation is adjusted.

Then, in an atmosphere of lead oxide (PbO) at about 1000° C. to 1200° C. (sintering auxiliary atmosphere), heat treatment of the PZT film formed at step S1 is performed (step S2).

On the other hand, as a comparative example, the substrate temperature is set to 600° C. in the film forming apparatus as shown in FIG. 4, and a PZT film having a thickness of about 10 µm is formed on the MgO substrate. In this case, a PZT powder having a center particle diameter of about 0.3 µm is used as a raw material, and the film formation conditions such as the gas pressure of the pressure regulating gas nozzle 103 is not changed during film formation. Thereby, a PZT film having crushed particles having a diameter of about 0.05 µm and nearly uniform particle diameter distribution relative to the depth direction in the film is formed. Then, the PZT film is heat-treated under the same conditions as those for the working example.

The degrees of orientation of the PZT orientation films obtained in the working example and the comparative example are evaluated by the Lotgering evaluation method using X-ray diffraction. Here, the degree of orientation "F" according to the Lotgering method is obtained by the following equation (1) using peak intensity of 20-0 method X-ray diffraction (XRD) pattern.

$$F=(p-p_0)/(1-p_0) \quad (1)$$

In the equation (1), "p" represents $\Sigma I(00L)/\Sigma I(HKL)$ of a sample as a target of evaluation, i.e., the PZT orientation film fabricated in the working example and "I" represents X-ray diffraction intensity from a crystal surface (HKL), whereas "$p_0$" represents "p" value of a reference sample, i.e., non-orientation PZT film. The degree of orientation is F=1 in the case of a single crystal, and the degree of orientation is F=0 in the case of a non-orientation polycrystal. Although the Lotgering method is an expedient method of evaluating degree of orientation, the fact has been reported that there is good correlation between the degree of orientation "F" and properties of the oriented polycrystal in the case of a magnetic material (Toshihiko Tani, "Highly Textured Piezoelectric Ceramics by RTGG Method", R&D Review of Toyota CRDL, Vol. 36, No. 3, September, 2001).

As a result, it is confirmed that, the degree of orientation is about 30% in the comparative example (the case where the particle diameters of PZT are distributed with no gradient), whereas the degree of orientation is improved to near 80% in the working example. Thereby, it is found that priority is given to the orientation of the crystal grains from the interface side with the MgO single crystal substrate in the PZT film.

In the working example described above, the MgO single crystal substrate is used as the seed substrate. However, it is conceivable that the same effect as in the working example can be obtained when a crystal having lattice constant relatively near that of PZT, such as SRO (strontium ruthenium oxide), is used instead.

Further, in the working example, a low melting point sintering auxiliary agent such as PbO may be added to the entire PZT film. It is confirmed that the orientation temperature of a ceramic is shifted to the lower temperature side thereby.

By the way, in the first embodiment of the present invention, as another method of controlling the particle diameter distribution of the film formed on the substrate, the injection energy may changed when the raw material powder is injected from the nozzle 107 as shown in FIG. 4. This is because, the larger the injection energy, the finer the raw material colliding with the substrate is crushed, and the particle diameter becomes smaller. As an example of the method of changing the injection energy, there are methods of varying the gas carrying speed by changing the kind of carrier gas, and varying the differential pressure between the aerosol generation chamber 101 and the film formation chamber 105.

Alternatively, as yet another method of controlling the particle diameter distribution of the film formed on the substrate, the AD method may be performed by using plural kinds of raw material powder having different diameters. In this case, aerosol generation chambers and nozzles for injecting aerosols in desired number may be additionally provided to the film forming apparatus as shown in FIG. 4.

Next, the method of manufacturing an orientation film according to the second embodiment of the present invention will be explained by referring to FIGS. 5A to 7. In the embodiment, a solid solution impurity having a function of suppressing crystal grain growth is used as an additive.

Figure 5A:
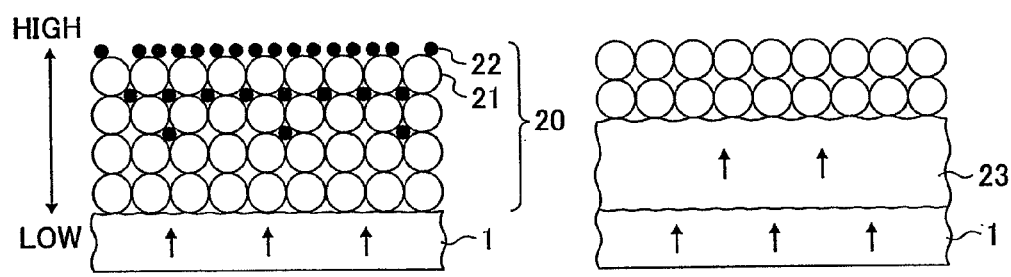
FIGS. 5A and 5B are diagrams for explanation of the method of manufacturing an orientation film according to the second embodiment of the present invention.

First, at step S1 in FIG. 2, a ceramic film 20 to which the solid solution impurity has been added is formed on the seed substrate 1 as shown in FIG. 5A. In the ceramic film 20, solid solution impurities 22 located between ceramic particles 21 are distributed such that the concentration gradually becomes higher from the layer (lower layer) near the seed substrate 1 toward the upper layer. Further, as the solid solution impurity, $MgO$, $Al_2O_3$ or the like is used.

Figure 6:
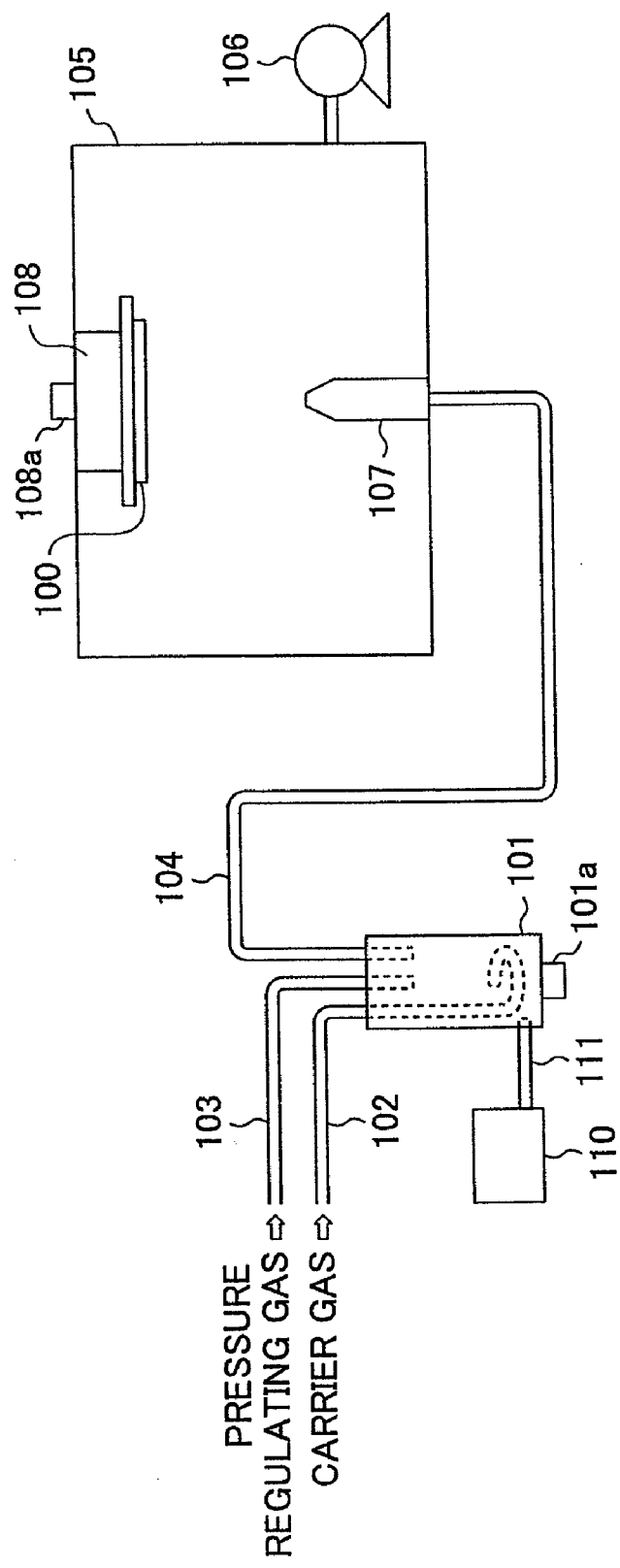
FIG. 6 is a schematic diagram showing a film forming apparatus according to the AD method provided with a mechanism of supplying an additive.

Such a ceramic film 20 can be formed by a film forming apparatus as shown in FIG. 6 or 7 using the AD method.

The film forming apparatus shown in FIG. 6 is additionally provided with an additive supply part 110 and an additive supply nozzle 111 to the film forming apparatus shown in FIG. 4. Other constitution is the same as that of the film forming apparatus shown in FIG. 4.

The additive supply part 110 supplies a predetermined amount of additive to the additive supply nozzle 111 with predetermined timing. The additive supply nozzle 111 introduces the additive supplied from the additive supply part 110 into the aerosol generation chamber 101.

In such a film forming apparatus, ceramic particles are placed in the aerosol generation chamber 101 as a raw material, and the solid solution impurity is placed in the additive supply part 110. Here, the particle diameter of the solid solution impurity is desirably in the same range as that of the raw material placed in the additive supply part 110. For example, in the case where PZT powder having an average particle diameter of about 0.3 µm is used as the raw material, powder of MgO or powder of $Al_2O_3$ having an average particle diameter of about 0.3 µm is used as the solid solution impurity. Then, the aerosol is injected from the nozzle 107 toward the seed substrate set in the substrate holder 108 while the amount of solid solution impurity supplied from the additive supply part 110 to the aerosol generation chamber 101 is gradually increased. Thereby, the concentration of the solid solution impurity mixed in the ceramic film to be formed on the substrate can be distributed such that it becomes higher with a gradient relative to the thickness direction of the ceramic film.

On the other hand, the film forming apparatus shown in FIG. 7 is additionally provided with an aerosol generation chamber 201, a raising gas nozzle 202, a pressure regulating gas nozzle 203, and an aerosol carrying pipe 204, and an injection nozzle 207 to the film forming apparatus shown in FIG. 4. Other constitution is the same as that of the film forming apparatus shown in FIG. 4.

The aerosol generation chamber 201 is a container in which an additive such as a solid solution impurity is placed. In the aerosol generation chamber 201, an aerosol is generated by supplying a carrier gas from the raising gas nozzle 202. The aerosol is injected from the injection nozzle 207 with desired timing and desired intensity by regulating the gas pressure of the pressure regulating gas supplied from the pressure regulating gas nozzle 203.

In such a film forming apparatus, ceramic powder is placed in the aerosol generation chamber 101 as a raw material, and the solid solution impurity is placed in the aerosol generation chamber 201. Here, the optimal particle diameter of the solid solution impurity placed in the aerosol generation chamber 201 varies according to the diameter of the raw material powder placed in the aerosol generation chamber 101 and the concentration of the additive, and, in the case where PZT powder having an average particle diameter of about 0.3 μm is used as the raw material, powder having an average particle diameter on the order of several tens of nanometers to several hundreds of nanometers is desirably used as the solid solution impurity. Then, film formation is performed by injecting the ceramic powder and the solid solution impurity powder from the injection nozzle 107 and the injection nozzle 207 toward the substrate 102 set in the substrate holder 108, respectively. Concurrently, the solid solution impurity injected from the injection nozzle 207 is gradually increased by adjusting the supplied amount of pressure regulating gas. Thereby, the concentration of the solid solution impurity mixed in the ceramic film to be formed on the substrate can be distributed such that it becomes higher with a gradient relative to the thickness direction of the ceramic film.

Figure 5B:
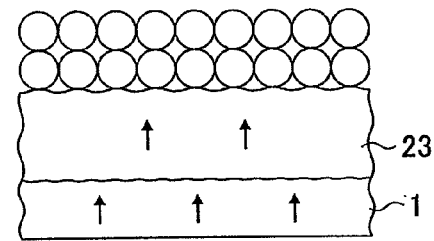

Then, at step S2 in FIG. 2, heat treatment is performed on the ceramic film 20 formed at step S1. Thereby, in the ceramic film 20 shown in FIG. 5A, priority is given to the progress of solid phase growth from the layer of lower solid solution impurity concentration, i.e., from the seed substrate 1 side. As a result, as shown in FIG. 5B, an orientation film 23 can be obtained in which crystal grains are oriented according to the crystal orientation of the seed substrate 1.

As a working example, a PZT orientation film is fabricated on an MgO single crystal substrate.

For this purpose, at first, the substrate temperature is set to 600° C. in the film forming apparatus shown in FIG. 6, and a PZT film, which has a thickness of about 10 μm and to which a solid solution impurity has been added, is formed on the MgO substrate (step S1). PZT powder having an average particle diameter of about 0.3 μm is used as the raw material, and powder of MgO or powder of $Al_2O_3$ having an average particle diameter of about 0.3 μm is used as the solid solution impurity. The solid solution impurity is distributed with a gradient such that the concentration of the solid solution impurity becomes higher from the lower layer to the upper layer in the formed PZT film. Furthermore, the concentration of the solid solution impurity is set to about 5 wt % in the highest region (upper layer of the PZT film).

Then, in a PbO atmosphere at about 1000° C. to 1200° C., heat treatment of the PZT film formed at step S1 is performed (step S2).

On the other hand, as a comparative example, a PZT film, to which no solid solution impurity has been added, is formed by using the same substrate and raw material at the same substrate temperature as those in the working example. Then, the PZT film is heat-treated under the same conditions as those in the working example.

The degrees of orientation of the PZT orientation films obtained in the working example and the comparative example are evaluated by the Lotgering evaluation method using X-ray diffraction. As a result, it is confirmed that, the degree of orientation is about 30% in the comparative example (the case where no solid solution impurity is added), whereas the degree of orientation is improved to near 80% in the working example. Thereby, it is found that priority is given to the orientation of the crystal grains from the interface side with the MgO single crystal substrate in the PZT film.

In the working example, a low melting point sintering auxiliary agent such as PbO may be also added to the entire PZT film. It is confirmed that the orientation temperature of ceramic is shifted to lower temperature side thereby.

Next, the method of manufacturing an orientation film according to the third embodiment of the present invention will be described by referring to FIGS. 2, 8A, and 8B. In the embodiment, a sintering auxiliary agent (low melting point auxiliary agent) that promotes crystal grain growth is used as an additive.

First, at step S1 in FIG. 2, a ceramic film 30 to which the sintering auxiliary agent has been added is formed on the seed substrate 1 as shown in FIG. 8A. In the ceramic film 30, sintering auxiliary agents 32 located between ceramic particles 31 are distributed such that the concentration gradually becomes higher from the layer (lower layer) near the seed substrate 1 toward the upper layer. As the sintering auxiliary agent, for example, PbO, $LiBiO_2$, LiF, $Li_3PO_4$, $Li_2CO_3$, $Li_2SO_4$, $Li_2O_3$, $Bi_2O_3$, $Li_2CO_3$—$Bi_2O_3$—$B_2O_3$, $BiF_3$—LiF, PbO—$B_2O_3$, $PbF_2$—$PbBr_2$, $ZrF_4$—LiF, PbO—$Bi_2O_3$—$V_2O_5$, Pb complex compound or Bi complex compound is used singly or the mixture of them is used.

Such a ceramic film 30 is formed by the film forming apparatus shown in FIG. 6 or 7 in a manner similar to that of the second embodiment. The sintering auxiliary agent with particle diameter in the same range of that of the raw material is desirably used in the case of using the film forming apparatus shown in FIG. 6. Further, in the case of using the film forming apparatus shown in FIG. 7, the particle diameter varies according to the diameter of the raw material powder and the concentration of the additive. For example, when PZT powder having an average particle diameter of about 0.3 μm is used as the raw material, powder having an average particle diameter on the order of several tens of nanometers to several hundreds of nanometers is desirably used as the sintering auxiliary agent.

Then, at step S2 in FIG. 2, heat treatment is performed on the ceramic film 30 formed at step S1. Thereby, in the ceramic film 30 shown in FIG. 8A, priority is given to the progress of solid phase growth from the layer of higher sintering auxiliary agent concentration, i.e., from the seed substrate 1 side. As a result, as shown in FIG. 8B, an orientation film 33 can be obtained in which crystal grains are oriented according to the crystal orientation of the seed substrate 1.

As a working example, a PZT orientation film is fabricated on an MgO single crystal substrate.

For this purpose, at first, the substrate temperature is set to 600° C. in the film forming apparatus shown in FIG. 6, and a PZT film, which has a thickness of about 10 μm and to which a low melting point sintering auxiliary agent has been added, is formed on the MgO substrate (step S1). PZT powder having an average particle diameter of about 0.3 μm is used as the raw material, and PbO powder having an average particle diameter of about 0.3 μm is used as the low melting point sintering auxiliary agent. Further, the low melting point sintering auxiliary agent is distributed with a gradient such that the concentration of the low melting point sintering auxiliary agent becomes lower from the lower layer to the upper layer in the formed PZT film. Furthermore, the concentration of the low melting point sintering auxiliary agent is set to about 10 wt % in the highest region (substrate side of the PZT film).

Then, in a PbO atmosphere at about 1000° C. to 1200° C., heat treatment of the PZT film formed at step S1 is performed (step S2).

On the other hand, as a comparative example, a PZT film, to which the sintering auxiliary agent has been added entirely and uniformly, is formed by using the same substrate and raw material at the same substrate temperature as those in the working example in the film forming apparatus shown in FIG. 6. In this case, the amount of solid solution impurity supplied from the additive supply part 110 (FIG. 6) to the aerosol generation chamber 101 is not changed and the distribution of the sintering auxiliary agent becomes uniform. Then, the PZT film is heat-treated under the same conditions as those in the working example.

The degrees of orientation of the PZT orientation films obtained in the working example and the comparative example are evaluated by the Lotgering evaluation method using X-ray diffraction. As a result, it is confirmed that, the degree of orientation is about 30% in the comparative example (the case where the concentration of the sintering auxiliary agent is distributed with no gradient), whereas the degree of orientation is improved to near 80% in the working example. Thereby, it is found that priority is given to the orientation of the crystal grains from the interface side with the MgO single crystal substrate in the PZT film.

Next, the method of manufacturing an orientation film according to the fourth embodiment of the present invention will be described by referring to FIGS. 2, 9A, and 9B.

First, at step S1 in FIG. 2, a ceramic film 40 is formed on the seed substrate 1 as shown in FIG. 9A. In the embodiment, as the seed substrate 1, a material transparent for predetermined wavelengths is used. For example, an MgO single crystal transparent in a wavelength range from visible light to infrared ray.

Then, at step S2 in FIG. 2, heat treatment is performed on the ceramic film 40 while energy is supplied locally to the interface between the seed substrate and the ceramic film 40. Specifically, an energy line is applied toward the interface of the ceramic film 40 from the backside of the transparent seed substrate 1. Thereby, solid phase growth is especially promoted in the region in which the energy line is applied, and priority is given to the progress of solid phase growth from the seed substrate 1 side of the ceramic film 40 shown in FIG. 9A. As a result, as shown in FIG. 9B, an orientation film 41 can be obtained in which crystal grains are oriented according to the crystal orientation of the seed substrate 1.

As the kind of energy to be used at step S2, a wavelength range, that can be transmitted through the seed substrate 1 and absorbed by PZT, is desirably used. Specifically, application of microwave, application of high power laser containing infrared to ultraviolet, application of plasma, etc. can be utilized.

In the case of using microwave, since the surface energy of the particles to which the microwave has been applied is directly activated, they do not reach high temperature. Accordingly, the microwave is effective in the case where the heat treatment is desired at relatively low temperature. Further, in the case of using a laser, a short pulse laser on the order of femtosecond is desirably used. This is because the short pulse laser can locally apply very high energy, although it has not so large average power of several milli-watts but the peak power of several tens of watts or more. When such a short pulse laser is applied from the seed substrate side to the ceramic film at a high speed during heat treatment, the temperature steeply rises in the region to which the laser has been applied (interface between the seed substrate and the ceramic film), and thereby, priority can be given to the progress of solid phase growth from the interface. By the way, when the wavelength of the laser beam applied to the particles is made shorter, the action to directly activate the particle surfaces becomes stronger than thermal activation of particles by energy absorption, and therefore, shifting the wavelength of the laser beam to the ultraviolet side is effective in the case where the heat treatment is desired at relatively low temperature.

In the embodiment, when the ceramic film is formed at step S1, known methods other than the AD method can be used. However, according to the AD method, the ceramic film can be formed in strong and close contact with the seed substrate, priority can be given to the orientation of the ceramic film from the seed substrate side more efficiently.

As a working example, a PZT orientation film is fabricated on an MgO single crystal substrate.

For this purpose, at first, the substrate temperature is set to 600° C. in the film forming apparatus shown in FIG. 4, and a PZT film having a thickness of about 10 μm is formed on the MgO substrate (step S1). At that time, PZT powder having an average particle diameter of about 0.3 μm is used as the raw material.

Then, in a PbO atmosphere at about 1000° C. to 1200° C., heat treatment of the PZT film formed at step S1 is performed (step S2). Further, at the same time of the heat treatment, a femto-second laser having a wavelength of 780 nm is applied only to the interface part between the MgO substrate and the PZT film.

On the other hand, as a comparative example, a PZT film is formed under the same conditions as those in the working example. Then, the PZT film is heat-treated in a PbO atmosphere at about 1000° C. to 1200° C.

The degrees of orientation of the PZT orientation films obtained in the working example and the comparative example are evaluated by the Lotgering evaluation method using X-ray diffraction. As a result, it is confirmed that, the degree of orientation is about 30% in the comparative example (the case where no femtosecond laser is applied), whereas the degree of orientation is improved to near 80% in the working example. Thereby, it is found that priority is given to the orientation of the crystal grains from the interface side with the MgO single crystal substrate in the PZT film.

In the working example, a low melting point sintering auxiliary agent such as PbO may be also added to the entire PZT film. It is confirmed that the orientation temperature of ceramic is shifted to lower temperature side thereby.

Next, a modified example of the method of manufacturing an orientation film according to the fourth embodiment of the present invention will be described by referring to FIG. 10.

In the modified example, when the energy is supplied in parallel with the heat treatment, the energy line is applied from the direction in parallel with the interface between the seed substrate and the ceramic film to the interface as shown in FIG. 10. Thereby, solid phase growth is especially promoted in the region in which the energy line is applied, and therefore, priority can be given to the progress of solid phase growth from the seed substrate 1 side of the ceramic film 40.

In the above-mentioned first to fourth embodiments of the present invention, a single crystal substrate of MgO, SRO or the like has been used as the seed substrate. However, even a polycrystal may be used as the seed substrate as long as it is oriented to some degree. For example, a silicon substrate, on which a vapor phase epitaxial growth film or a liquid phase epitaxial growth film has been formed, may be used as the seed substrate. Because the adhesion between the ceramic film and the seed substrate becomes higher by using the AD method, and the orientation in the ceramic film is faithfully controlled according to the crystal orientation of the seed substrate. Since the range of choices of materials available as a seed substrate can be expanded, industrial ceramic film orienting process can be realized at low cost by using inexpensive materials such as silicon.

As a working example, a platinum (Pt) orientation film having a thickness of about 100 nm is formed on a silicon (111) substrate by using a known method such as sputtering method. The platinum orientation film is provided so as to block the diffusion between silicon and PZT because lead (Pb) contained in PZT react readily with silicon. Further, as the diffusion block layer, not only platinum but also a metal that is easily oriented such as iridium (Ir) may be used.

Then, a PZT orientation film having a thickness of about several hundreds of nanometers is formed on the platinum or iridium orientation film by the sputtering method. The resulting plate is used as a seed substrate. On the seed substrate, a PZT film having a thickness of about 10 μm is formed by the AD method. As a film formation condition at the time of film formation, the substrate temperature is set to 600° C. Further, in the PZT film, PZT particles are distributed with a gradient such that the particle diameter gradually increases from the seed substrate side (lower layer) toward the upper layer of the PZT film. The method of forming the film, in which particle diameter is distributed with a gradient, is the same as that in the first embodiment. In addition, to promote the solid phase growth at lower temperature, a sintering auxiliary agent (e.g., 10 wt % PbO) is added to the entire PZT film.

Then, heat treatment is performed on the PZT film formed on the seed substrate in an atmosphere at about 800° C.

On the other hand, as a comparative example, a PZT film is formed by using the same seed substrate and raw material powder as those in the working example. In this case, the diameters of the PZT particles are distributed with no gradient in the PZT film. Further, the sintering auxiliary agent is added in the same way as in the working example. Then, the PZT film is heat-treated under the same conditions as those in the working example.

The degrees of orientation of the PZT orientation films obtained in the working example and the comparative example are evaluated by the Lotgering evaluation method using X-ray diffraction. As a result, it is confirmed that, the degree of orientation is about 0% in the comparative example (the case where the particle diameter of PZT particles is distributed with no gradient), whereas the degree of orientation is improved to near 60% in the working example, and the low temperature orientation has progressed. Thereby, it is found that priority is given to the orientation of the crystal grains from the interface side with the PZT orientation film of the seed substrate in the PZT film.

Here, when the seed substrate is fabricated, as the method of forming the orientation film on the silicon substrate, not only the vapor phase epitaxial method including the sputtering method that has been described in the working example, but also a liquid phase epitaxial method including the sol-gel method and MOD (Metalorganic Decomposition) method may be used.

The above-mentioned methods of manufacturing an orientation film according to the first to fourth embodiments of the present invention is especially suitable for the case of manufacturing a film of a functional material that expresses piezoelectric effect, electro-optical effect, pyroelectric effect, magneto-optical effect and nonlinear optical effect, for example. This is because those effects are efficiently expressed by increasing the degree of orientation of the film. For example, in a piezoelectric material film, the film becomes easier to be polarized when the film is oriented, and the piezoelectric property d31 considerably increases to about four times the case where the film is not oriented.

In recent years, the use of non-lead piezoelectric material has been studied in consideration of environmental problems etc. However, under the present circumstances, the low piezoelectric performance produces a bottleneck in practical application. Therefore, the application of the method of manufacturing an orientation film according to any one of the above embodiments has the potential to realize a high-performance non-lead piezoelectric material. Further, the method of manufacturing an orientation film according to any one of the above embodiments is effective in the case where the anisotropy due to orientation becomes an important factor as in the case of PLZT that expresses electro-optical effect or $LiNbO_3$ that expresses nonlinear optical effect.

The method of manufacturing an orientation film according to any one of the above embodiments can be utilized, for example, when a piezoelectric actuator for driving a liquid discharge head is manufactured and when an ultrasonic transducer for transmitting and receiving ultrasonic waves in an ultrasonic probe provided in an ultrasonic imaging apparatus is manufactured. By using an oriented piezoelectric material film in an element such as the piezoelectric actuator, the ultrasonic transducer or the like, the performance of the instruments including such element may be improved. Further, as described above, since an inexpensive substrate having good workability such as silicon, SUS (stainless steel) or the like may be used and the performance of the PZT film is improved, the costs of manufacturing the instruments including piezoelectric elements can be reduced and the reliability can be improved.

Next, a method of manufacturing a liquid discharge head to which the methods of fabricating an orientation film according to the first to fourth embodiments of the present invention are applied will be described.

Figure 11:
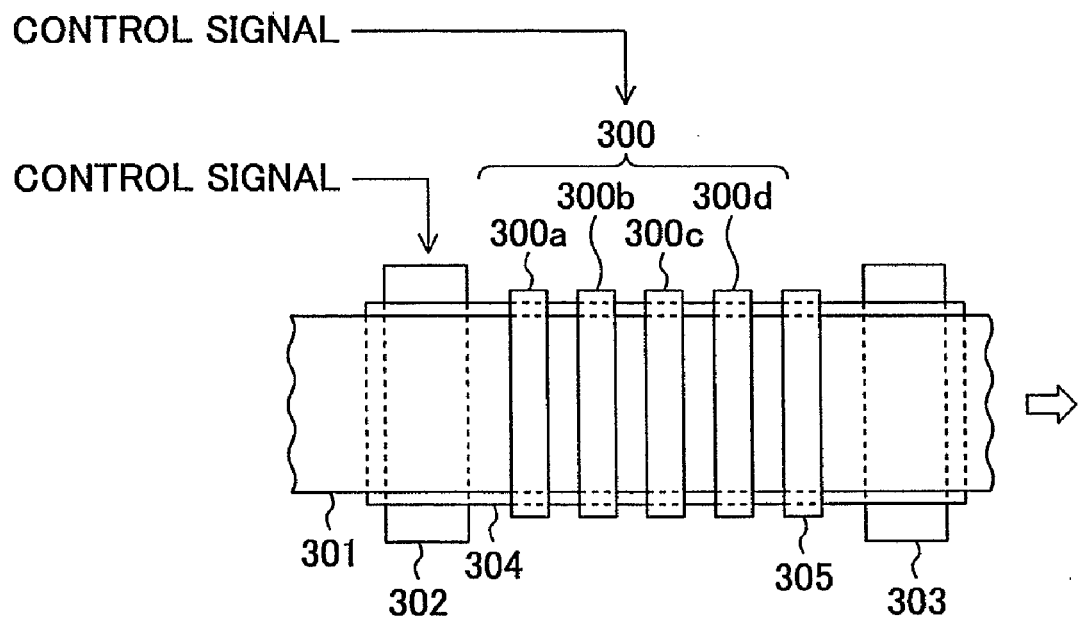
FIG. 11 is a plan view showing a peripheral structure of a printing unit of an inkjet printer.

FIG. 11 is a plan view showing a periphery of a printing unit of an inkjet printer to which the liquid discharge head is applied. As shown in FIG. 11, the printing unit 300 is located above a recording paper 301 adhering to or held by a belt 304 hanging on rollers 302 and 303. The recording paper 301 is fed in a direction of an arrow by the rollers 302 and 303 driven according to control signals and the belt 304.

The printing unit 300 includes plural liquid discharge heads 300a to 300d that discharge inks. These liquid discharge heads 300a to 300d are line shape heads having lengths corresponding to the paper width of the recording paper 301. Each of the liquid discharge heads 300a to 300d includes plural nozzle parts arranged on a line perpendicular to the paper feed direction of the recording paper 301, and discharges inks of black, cyan, magenta, and yellow, respectively. Further, a printing detection unit 305 includes a line sensor for imaging printing results by the printing unit 300, and detects discharge failure such as clogging of nozzles based on the images read by the line sensor.

Figure 12:
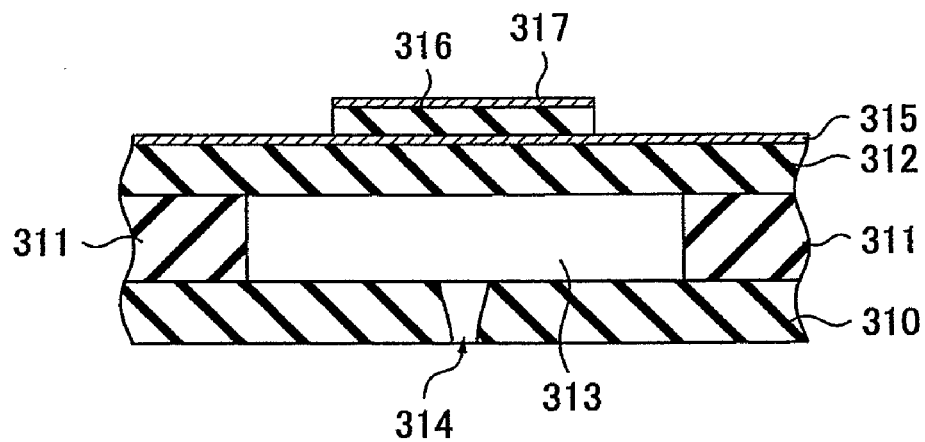
FIG. 12 shows a part of a section of a liquid discharge head as shown in FIG. 11.

FIG. 12 shows a part of a section of the liquid discharge heads 300a to 300d as shown in FIG. 11. As shown in FIG. 12, the liquid discharge head includes a nozzle plate 310, partition walls 311 that divide space above the nozzle plate 310 into plural regions, and a vibrating plate 312 located on the partition walls 311. A pressure chamber 313 is defined by the nozzle plate 310, the partition walls 311 and the vibrating plate 312. The pressure chamber 313 is filled with an ink of predetermined color. Further, a liquid discharge opening (nozzle part) 314 is formed within the face of the nozzle plate 310 in association with the location of the pressure chamber 313. Furthermore, a lower electrode 315 is formed on the vibrating plate 312, and a piezoelectric material 316 is provided thereon. On the piezoelectric material 316, an upper electrode 317 is formed. Each of the liquid discharge heads 300a to 300d is provided with a plurality of such pressure chambers. In FIG. 12, a mechanism for replenishing inks to the respective liquid discharge heads is omitted for ease of explanation.

When printing is performed, a voltage is applied to the lower electrode 315 and the upper electrode 317 according to control signals. Thereby, the piezoelectric material 316 expands and contracts by the piezoelectric effect and the vibrating plate 312 deforms. As a result, the volume of the pressure chamber 313 changes, and thereby, the ink in the chamber is pressurized and dropped from the liquid discharge opening 314.

Such a liquid discharge head is manufactured in the following manner. Although a number of pressure chambers etc. are formed in parallel in the normal manufacturing process, only one is shown in FIGS. 13A to 13G for ease of explanation.

First, a seed substrate to be used for fabricating a piezoelectric material film for driving the liquid discharge head is prepared. For this purpose, a platinum or iridium orientation film having a thickness of about 100 nm is formed on a silicon (111) substrate by the sputtering method. Then, a PZT orientation film having a thickness of about several hundreds of nanometers is formed on the platinum or iridium orientation film by the sputtering method. The resulting plate is used as a seed substrate.

Figure 13A:
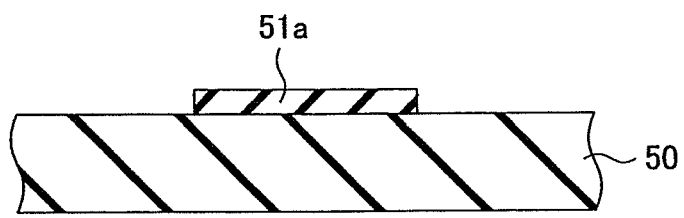
FIGS. 13A to 13G are diagrams for explanation of a method of manufacturing a liquid discharge head according to one embodiment of the present invention.

Then, as shown in FIG. 13A, a PZT film 51a having a thickness of about 10 μm and a bottom size of about 300 μm×300 μm square is formed on a seed substrate 50. The PZT film 51a can be formed by the AD method using a mask provided with an opening corresponding to the location of the pressure chamber 313 (FIG. 12). As a film formation condition, for example, the substrate temperature is set to about 600° C. Further, in the PZT film 51a, PZT particles are distributed with a gradient such that the particle diameter gradually increases from the seed substrate side (lower layer) toward the upper layer of the PZT film. The method of forming the film in which particle diameter is distributed with a gradient is the same as that in the first embodiment. In addition, to promote the solid phase growth at lower temperature, a sintering auxiliary agent (e.g., 10 wt % PbO) may be added to the entire PZT film.

Then, heat treatment is performed on the PZT film 51a shown in FIG. 13A in an atmosphere at about 800° C. Thereby, the crystal grains contained in the PZT film 51a solid phase grows from the seed substrate 50 side, and is oriented according to the crystal orientation of the seed substrate 50.

Figure 13B:
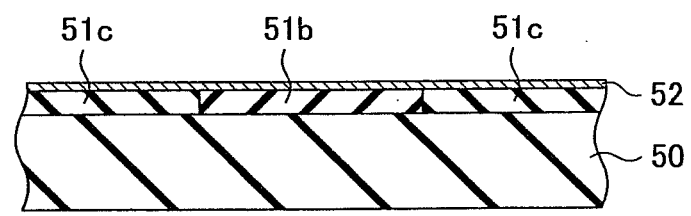
Figure 13C:
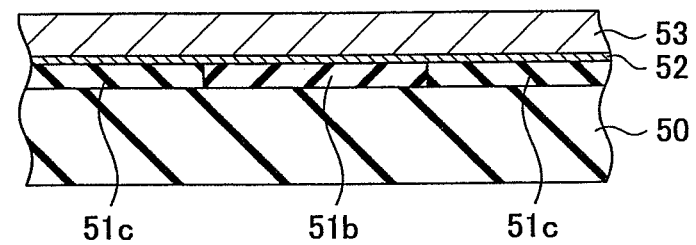

Then, as shown in FIG. 13B, resists 51c are placed in regions other than the PZT film (PZT orientation film) with crystal grains oriented by the heat treatment, and a platinum electrode 52 is formed on the PZT orientation film and the resists by the sputtering method. Then, as shown in FIG. 13C, on the platinum electrode 52, a chromium (Cr) film 53 having a thickness of about 15 μm is formed by the sputtering method or plating method. The chromium film 53 functions as a vibrating plate in the liquid discharge head.

Figure 13D:
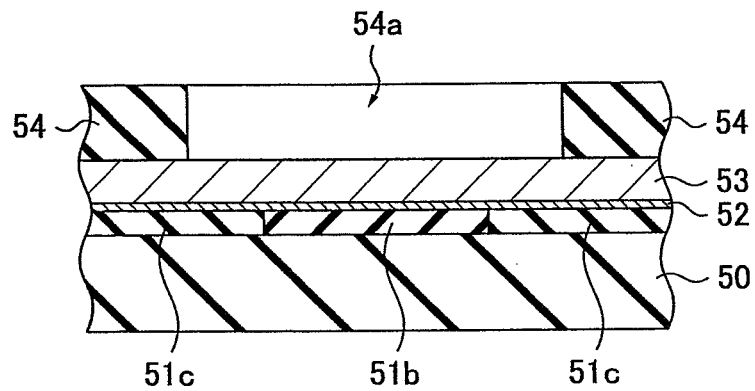

Then, as shown in FIG. 13D, partition wall structures 54 for defining the pressure chamber 313 (FIG. 12) are placed on the chromium film 53. The partition wall structure 54 is a columnar structure provided with plural openings 54a having a bottom size of about 500 μm×500 μm square, and can be fabricated by etching a material of silicon, SUS or the like. The partition wall structures 54 are arranged such that the center of the opening 54a corresponds to the center of the PZT orientation film 51b, and bonded to the chromium film 53.

Figure 13E:
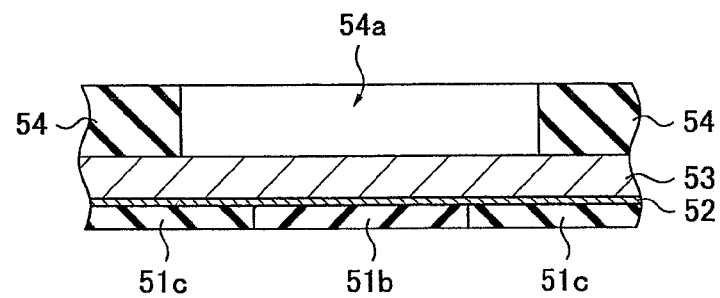
Figure 13F:
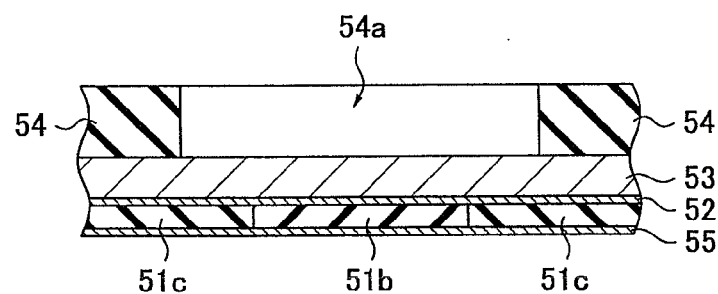

Then, as shown in FIG. 13E, the seed substrate 50 is removed by peeling or etching. As etching, wet etching using a BHF (buffer hydrofluoric acid) solution or dry etching may be performed. Note that, in the step, as long as at least the silicon substrate in the seed substrate 50 is removed, the platinum or iridium orientation film that has been formed on the silicon substrate may be left intact or removed by grinding or the like. Furthermore, as shown in FIG. 13F, a platinum electrode 55 is formed by sputtering method on the surface from which the seed substrate has been removed, and then, the resists 51c are removed.

Figure 13G:
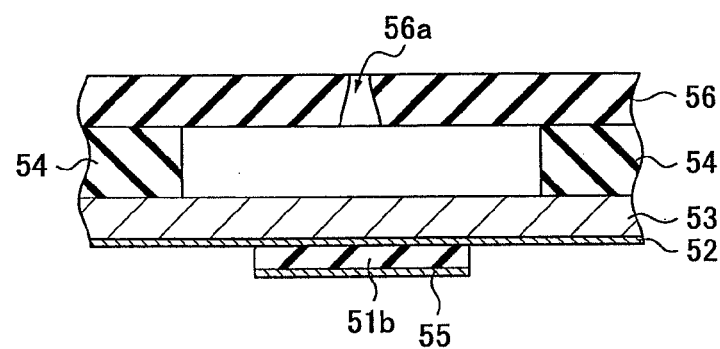

Then, as shown in FIG. 13G, a nozzle plate 56 is placed on the partition wall structures 54. The nozzle plate 56 is a structure of a plate material of silicon, SUS or the like with plural nozzle parts 56a formed therein. The nozzle plate 56 is placed such that the position of the nozzle part 56a corresponds to the position of the pressure chamber (the opening 54a of the partition wall structure 54), and bonded to the partition wall structures 54. Thereby, the liquid discharge head is completed.

In the above-mentioned method of manufacturing the liquid discharge head, the PZT orientation film is formed by the method of manufacturing an orientation film according to the first embodiment of the present invention. However, the method of manufacturing an orientation film according to any one of the second to fourth embodiments also may be used.

Further, in the above-mentioned embodiments of the present invention, when film formation by the AD method is performed, the aerosol generation mechanism is not limited to the constitution as shown in FIG. 4, 6 or 7. That is, various constitutions may be used as long as they can generate a state in which raw material powder is dispersed in a gas. For example, not the constitution in which the gas is introduced into the container (storage container) storing the raw material powder, but the constitution in which a predetermined amount of raw material powder is taken out from the storage container and the raw material powder that has been taken out is aerosolized may be used. Specifically, the constitution including a storage container for raw material powder, a raw material powder supply part (powder supply board) rotationally driven for continuously receiving the supply of the raw material powder at a predetermined rate (supply rate) from the storage container and feeding the powder, and an aerosol generating part (aerosolizing part) for generating an aerosol by dispersing the raw material powder fed by the raw material powder supply part by the gas is given. In such a constitution, a stable amount of raw material powder can be supplied by forming grooves having predetermined widths into which the raw material powder is put, and the supplied amount of raw material powder can be controlled by adjusting the rate of the rotary driving of the raw material powder supply part. Then, the aerosol with stable concentration can be generated by dispersing the raw material powder by introducing the gas or by spraying the carrier gas directly to the grooves of the powder supply board.

Further, the constitution in which the raw material powder is agitated in the storage container of the raw material powder and the compressed gas is introduced into the storage container, a predetermined amount of raw material powder mixed with the compressed gas is taken out from the storage container, and it is exhausted from a small hole to the outside, and thereby, the raw material powder is dispersed utilizing the expansion of the compressed gas is also given. Furthermore, the constitution in which an aerosol is formed by continuously supplying the raw material powder to the flow path of the carrier gas to disperse the raw material powder in the carrier gas may be used.

The invention claimed is:

1. A method of manufacturing a liquid discharge head having (i) a pressure chamber to be filled with a liquid and defined by a vibrating plate, a partition wall, and a nozzle plate provided with a discharge opening, and (ii) a piezoelectric actuator for vibrating the vibrating plate to discharge the liquid stored in the pressure chamber from the discharge opening, said method comprising the steps of:

(a) forming a film containing a piezoelectric ceramic on a seed substrate, in which crystal orientation is controlled at least on a surface of said seed substrate, by using an aerosol deposition method of injecting powder containing said piezoelectric ceramic toward said seed substrate and depositing the powder on said seed substrate;

(b) heat-treating the film formed at step (a) to form a piezoelectric ceramic orientation film in which crystal grains contained in said film are oriented;

(c) forming an electrode on said piezoelectric ceramic orientation film;

(d) forming the vibrating plate on said electrode;

(e) forming the partition wall for defining the pressure chamber on said vibrating plate; and (f) forming the nozzle plate provided with the discharge opening on said partition wall;

wherein step (a) includes distributing the powder having different particle diameters in said film such that a particle diameter of the powder in said film gradually becomes larger with distance from said seed substrate.

2. The method according to claim 1, further comprising the step of:

removing said seed substrate from said piezoelectric ceramic orientation film by peeling.

3. The method according to claim 1, further comprising the step of:

removing said seed substrate from said piezoelectric ceramic orientation film by etching.

4. The method according to claim 1, wherein step (b) includes performing heat treatment while supplying energy to an interface between said seed substrate and said film.

5. The method according to claim 1, wherein step (a) includes adding a sintering auxiliary agent into said film.

6. The method according to claim 1, wherein step (b) includes performing heat treatment in a sintering auxiliary agent atmosphere.

* * * * *